United States Patent [19]
Van Dort

[11] Patent Number: 5,561,315
[45] Date of Patent: Oct. 1, 1996

[54] PROGRAMMABLE SEMICONDUCTOR DEVICE WITH HIGH BREAKDOWN VOLTAGE AND HIGH-DENSITY PROGRAMMABLE SEMICONDUCTOR MEMORY HAVING SUCH A SEMICONDUCTOR DEVICE

[75] Inventor: Maarten J. Van Dort, Eindhoven, Netherlands

[73] Assignee: U.S. Philips Corporation, New York, N.Y.

[21] Appl. No.: 318,005

[22] Filed: Oct. 4, 1994

[30] Foreign Application Priority Data

Oct. 5, 1993 [BE] Belgium ............... 09301040

[51] Int. Cl.$^6$ ............ H01L 27/10; H01L 23/525
[52] U.S. Cl. ............ 257/530; 257/513; 257/910
[58] Field of Search ............ 257/530, 50, 209, 257/910

[56] References Cited

U.S. PATENT DOCUMENTS 4,881,114  11/1989  Moshen et al. ............ 257/530
5,416,343  5/1995  Slotboom et al. ............ 257/476

FOREIGN PATENT DOCUMENTS 0599388  6/1994  European Pat. Off. .
0599390  6/1994  European Pat. Off. .

Primary Examiner—Robert P. Limanek
Assistant Examiner—David B. Hardy
Attorney, Agent, or Firm—Steven R. Biren

[57] ABSTRACT

A programmable semiconductor memory with filament or point diodes in the intersections of a matrix system can be manufactured with minimum dimensions and thus with a very high density owing to the absence of alignment tolerances. A possible problem is then posed by the strong leakage currents which may arise during programming owing to punch-through between adjoining diodes. Decreasing the leakage current through the use of a higher background concentration of the region in which these diodes are formed is not possible because this reduces the breakdown voltage of the pn junctions of the diodes too much. According to the invention, a more strongly doped surface zone is provided in the region between the diodes, which zone is situated at least at a distance from the diode points. In a specific embodiment, the zone extends less deeply into the region than do the diodes. The invention is based on the recognition that the breakdown voltage is determined by the location where the curvature of the diode is strongest. The zone suppresses the leakage current to a high degree, while the breakdown voltage of the diodes remains sufficiently high.

7 Claims, 2 Drawing Sheets

PROGRAMMABLE SEMICONDUCTOR DEVICE WITH HIGH BREAKDOWN VOLTAGE AND HIGH-DENSITY PROGRAMMABLE SEMICONDUCTOR MEMORY HAVING SUCH A SEMICONDUCTOR DEVICE

BACKGROUND OF THE INVENTION

The invention relates to a programmable semiconductor device comprising a semiconductor body provided with a comparatively weakly doped surface region of a first conductivity type which is covered by a dielectric layer on which a number of semiconductor regions of a second, opposite conductivity type and a comparatively high doping concentration are provided side by side, each semiconductor region in combination with the subjacent portions of the dielectric layer and the surface region forming a programmable element which is programmed in that a sufficiently high voltage is applied between the semiconductor region and the surface region, so that owing to breakdown across the dielectric layer a zone of the second conductivity type is formed in the surface region, which zone is conductively connected to the semiconductor region and forms a rectifying junction between the semiconductor region and the surface region. The invention also relates to a programmable semiconductor memory comprising such a semiconductor device.

A semiconductor device of the kind described above is known from, inter alia, U.S. Pat. No. 4,881,114. In this known device, the semiconductor body is formed by an n-type silicon substrate in which locally a p-type surface region is provided in the form of a diffused zone. The dielectric layer is formed, for example, by a thin composite layer of silicon oxide, silicon nitride, and silicon oxide. On this layer are formed semiconductor regions of comparatively strongly doped n-type polycrystalline silicon, called poly for short hereinafter. The dielectric layer forms an anti-fuse which makes a transition from non-conducting in the non-programmed state to conducting during programming. During programming, a sufficiently high voltage is applied between the p-type surface region in the semiconductor body and an n-type poly region, whereby breakdown takes place locally in the dielectric layer and a pinhole is formed in the dielectric layer. Owing to heat generation, n-type dopant diffuses from the poly into the p-type surface region, so that an n-type zone is created in this region which forms a pn junction with the surface region. Arranged in a matrix, these elements may form a programmable memory (PROM) or a programmable logic array (PLA). An important advantage of the use of such programmable elements is, as also stated in the cited US Patent, that extremely high densities can be obtained.

It was found in practice that, for example, in memories built up from these programmable elements strong leakage currents often occur between adjoining diodes, i.e. for example, greater than 1 nA. Among the disadvantages of these leakage currents is that programming proceeds with difficulty owing to voltage losses and also that the dissipation has an undesirably high value.

SUMMARY OF THE INVENTION

The invention accordingly has for its object to provide a semiconductor device of the kind described in the opening paragraph in which these leakage currents are reduced to an acceptably low level, while other properties are retained.

According to the invention, such a device is for this purpose characterized in that the surface region is provided with one or several surface zones of the same conductivity type as and with a higher doping concentration than the surface region, which surface zones extend between the semiconductor regions, as seen at the surface, and have a surface area within the surface region such that the breakdown voltage of the rectifying junctions formed during programming is at least substantially determined by the comparatively low doping concentration of the surface region and is not or at least substantially not influenced by the surface zones.

The invention is based inter alia on the following recognition. It is possible during programming that the programming voltage is applied in the reverse direction across a pn junction which was already formed, while 0 V is across an adjoining pn junction. The avalanche breakdown voltage of the pn junctions should accordingly be greater than the programming voltage. Given the usual thicknesses and/or compositions of the dielectric layer, this means that the avalanche breakdown voltage of the formed diodes must be above 10 V. Such a high breakdown voltage may be obtained through the choice of a suitable doping concentration of the p-type surface region in the substrate, for example, $4 * 10^{16}$ atoms per $cm^3$.

The interspacing between adjoining diodes will in general be as small as possible, for example, below 1 μm (which results inter alia in the high densities). The combination of said properties, i.e. a low substrate doping and a small interspacing, renders it possible for punch-through to occur between adjoining diodes of which one is strongly biased in the reverse direction and the other one is at a low voltage, whereby the depletion layer of the reverse-biased pn junction extends up to or close to the other pn junction and biases the latter in the forward direction, which gives rise to the said strong leakage currents. The punch-through effect described could in principle be suppressed by an increase in the doping concentration of the p-type surface region. This, however, could reduce the breakdown voltage of the diodes to an unacceptably low level. The measure according to the invention renders it possible to reduce the leakage currents considerably while maintaining a high breakdown voltage and a high density.

A further aspect of the invention is based on the recognition that the diodes formed in the semiconductor body upon breakdown of the dielectric layer are practically point-shaped, at least have such a shape owing to the small dimensions that breakdown occurs near the bottom of the diodes where the curvature of the pn junction is strongest. A major embodiment of a semiconductor device according to the invention is accordingly characterized in that the surface zone of the first conductivity type extends from the surface in a direction transverse to the surface into the semiconductor body over a depth which is smaller than the depth of the zone or zones of the second conductivity type which are formed in the surface region of the first conductivity type during programming and which adjoin the surface zone of the first conductivity type with their upright walls. The breakdown voltage is not or at least substantially not influenced by the higher doping concentration of the surface zone in that the depth of the surface zone of the first conductivity type is chosen to be sufficiently small. On the other hand, this surface zone has a favorable effect on the leakage currents because punch-through occurs mostly at or very close to the surface of the semiconductor body. The zone may be provided in an early stage in the process, as will become apparent from the description of the Figures, in particular before the poly regions are provided on the dielectric layer, so that the more strongly doped zone can also extend below the poly.

An embodiment of a semiconductor device according to the invention differing from the previous one is characterized in that the surface zones, as seen at the surface, are mutually separate and are provided in a self-aligned manner relative to the semiconductor regions of the second conductivity type in regions of the surface region which are situated between the semiconductor regions of the second conductivity type. Here, too, the surface region may be advantageously provided down to a depth at which the breakdown voltage of the diodes is not or at least substantially not reduced. When the dielectric layer does not breakdown at the edge of the semiconductor regions (poly) on the dielectric layer but in a location situated more centrally below the semiconductor regions, the more strongly doped surface zone in this embodiment will be laterally separated from the diodes which are formed during programming. This renders it possible to provide this zone to a depth equal to or greater than the depth of the diodes to be formed without a reduction in the breakdown voltage of the diodes. Owing to the comparatively great depth to which the more strongly doped surface zone can be provided in this embodiment, it is possible to suppress the leakage currents caused by punch-through further without an appreciable reduction in the breakdown voltage of the diodes.

A further embodiment of a semiconductor device according to the invention is characterized in that the surface region of the first conductivity type merges into a region, called substrate hereinafter, of the second conductivity type at the side opposed to the surface via a pn junction, a buried layer of the first conductivity type with a higher doping concentration than the surface region being formed at the interface between the surface region and the substrate. Since the resistance of the surface region is mainly determined by the strongly doped buried layer, the background concentration of the surface region may be chosen with a comparatively high degree of freedom, for example, very low with a view to an optimum breakdown voltage, while excessive series resistances in the selection lines of the memory are avoided. A preferred embodiment of the invention is for this purpose characterized in that the surface region is formed by a layer of the first conductivity type which is epitaxially provided on a substrate of the second conductivity type.

BRIEF DESCRIPTION OF THE DRAWING

The invention will be explained in more detail with reference to several embodiments and the accompanying diagrammatic drawing, in which.

Figure 4:
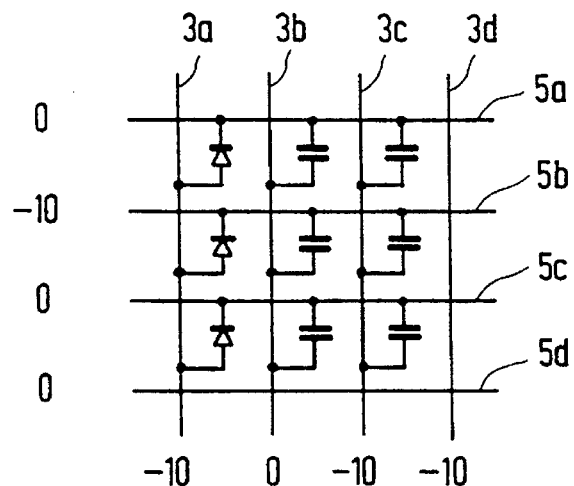
Figure 5:
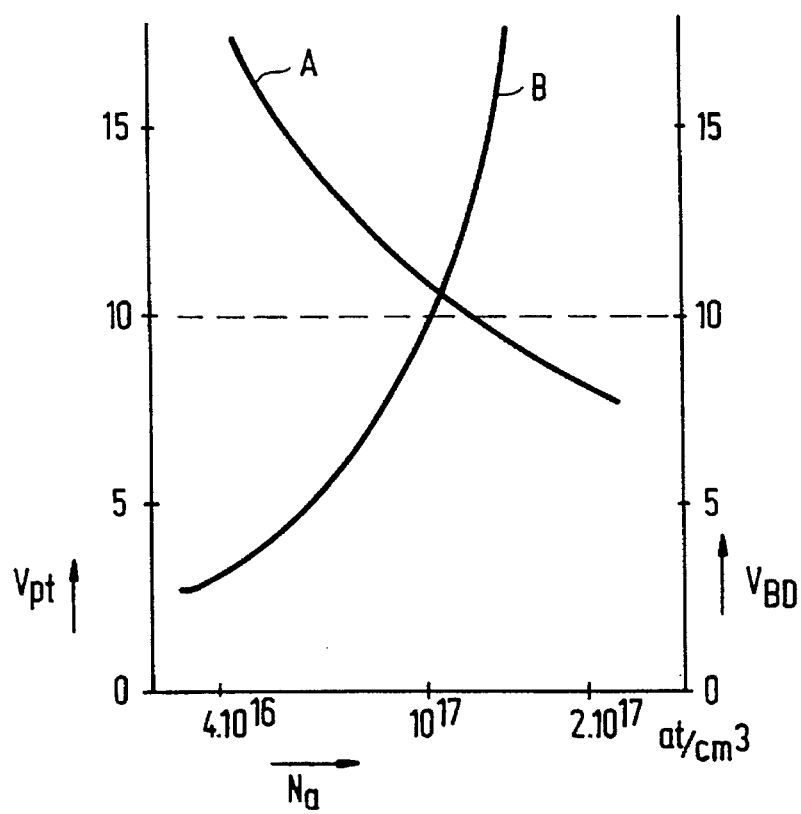
Figure 6:
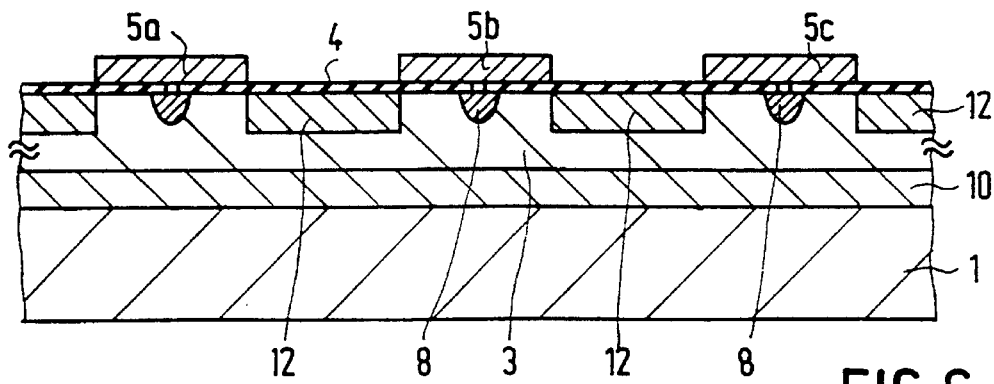

FIG.,3 is a cross-section of the same device taken on the line 3—3;

FIG. 4 is a circuit diagram of a programmable memory;

FIG. 5 is a graph showing the relation between doping concentration on the one hand and breakdown voltage and punch-through voltage on the other hand; and FIG. 6 is cross-section of a second embodiment of a device according to the invention.

DESCRIPTION OF THE PREFERRED EMBODIMENTS

The invention will be explained with reference to a programmable memory PROM below. It should be borne in mind that the invention is applicable not only to memories but can also be advantageously applied to integrated circuits known under the designation PLA (programmable logic array) or PLD (programmable logic device). The memory may be either a stand-alone memory or an embedded memory, i.e. a memory incorporated in another circuit, for example a microprocessor.

Figure 1:
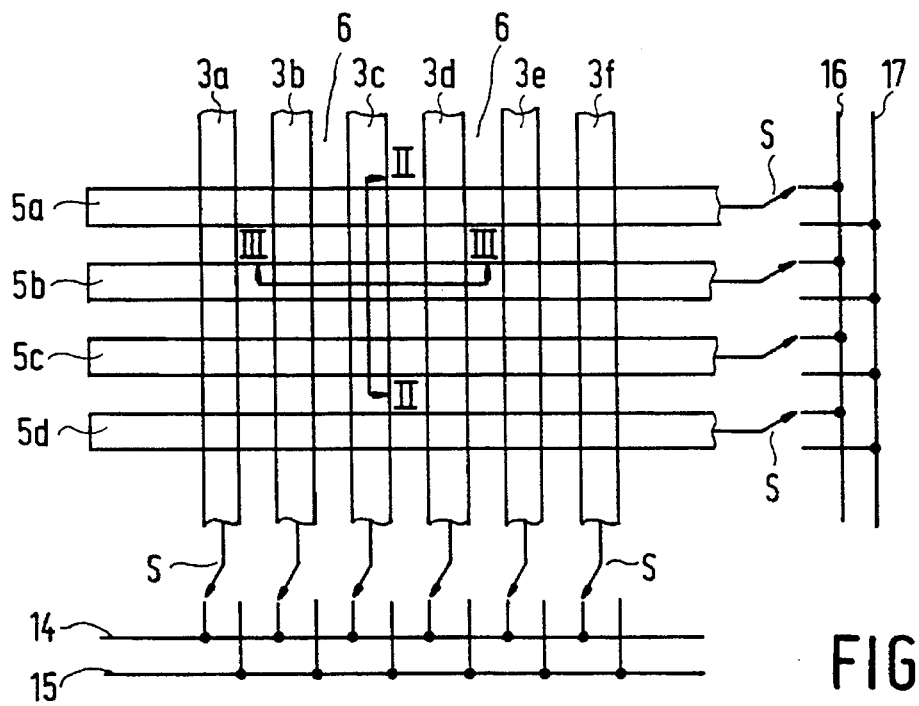
FIG. 1 is a plan view of a semiconductor device according to the invention.
Figure 2:
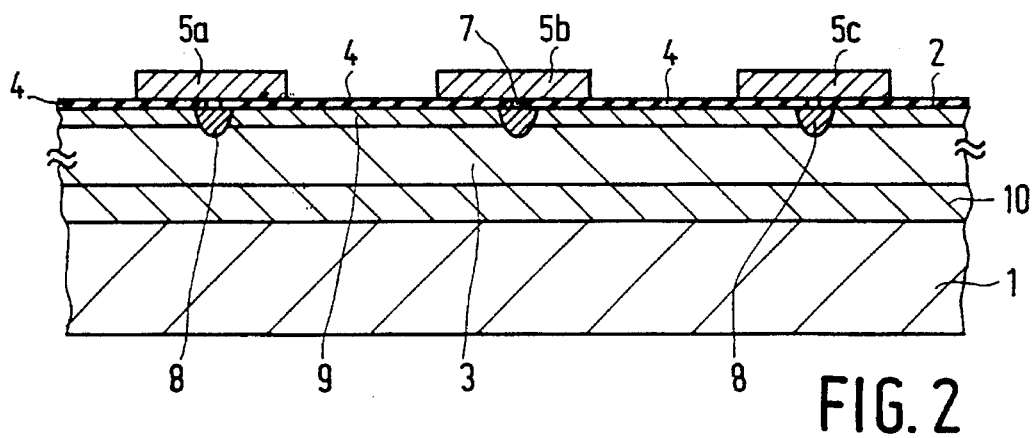
FIG. 2 is a cross-section of this device taken on the line II—II.
Figure 3:
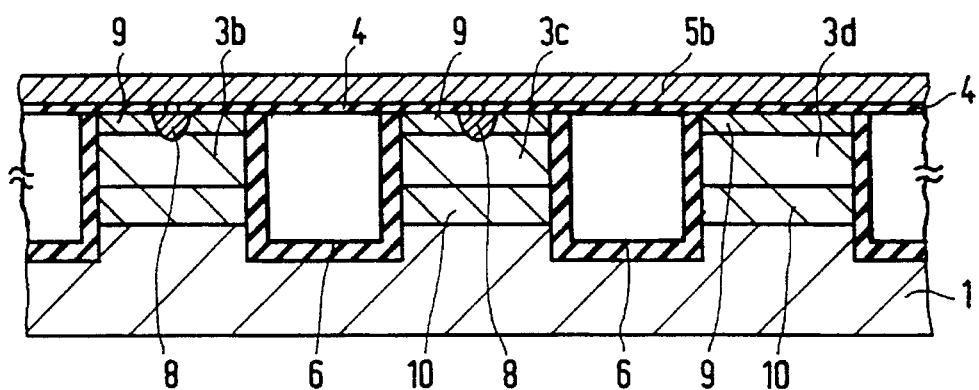

The device shown in FIGS. 1–3 comprises a semiconductor body 1, in this case made of silicon but possibly made of a different semiconductor material which is known per se. The body 1 which is mainly of the second in this case the n-conductivity type, comprises a comparatively weakly doped surface region 3 of a first conductivity type, in this case the p-type, which adjoins the surface 2. The surface region 3 is subdivided into insular regions by grooves 6 which extend down into the n-type region 1. These insular regions extend in the vertical direction in the plan view of FIG. 1 and are used as vertical selection lines of the memory. For mutual distinction, these regions have been given the reference numerals 3a, 3b, 3c, etc. Strongly doped p-type buried layers 10 are formed at the interfaces between the surface regions 3a, 3b, etc. in order to reduce the electrical resistance. The surface 2 is covered with a thin dielectric layer 4. This may be made simply of silicon oxide, but preferably comprises a composite layer of alternate oxide-nitride-oxide layers, also called ONO for short. A number of semiconductor regions 5 situated next to one another, for example made of polycrystalline silicon or poly, and of the second conductivity type, so in this example of the n-type, are provided on the dielectric layer 4. The semiconductor regions 5 extend in the horizontal direction over the memory matrix as shown in FIG. 1 and are used as horizontal selection lines. These lines have been given the reference numerals 5a, 5b, 5c, etc. for mutual distinction. The doping concentration of the semiconductor material of the lines 5 is comparatively high, i.e. high in comparison with the surface concentration in the p-type surface regions 3. The programmable memory elements are formed at the areas of the intersections of the matrix between the regions 5 in conjunction with the subjacent portions of the dielectric layer 4 and the surface regions 3. The thickness of the dielectric layer 4 and the surface concentration in the surface regions 3 and the doping concentration of the semiconductor regions 5 are so chosen that the application of a sufficiently high voltage between a selected surface region 3 and a selected semiconductor region 5 causes an electrical breakdown across the dielectric layer 4. An opening or pinhole 7, three of which are shown by way of example in FIG. 2, is created locally in the layer 4, i.e. where the layer 4 is weakest. Owing to heat generation, the pinholes are filled with semiconductor material during the breakdown and simultaneously dopant diffuses from the n-type semiconductor regions 5 into the surface region 3 thus forming a diode with a very shallow and very small n-type zone 8 which forms a pn junction with the p-type region 3.

To reduce the leakage current between adjoining diodes, according to the invention, the surface region 3 is provided with one or several surface zones 9 of the same type (so the p conductivity type) as and with a higher doping concentration than the surface region 3. As is evident from FIG. 2, the surface zones 9 extend at least in the regions situated between the semiconductor regions 5, and accordingly between adjoining diodes formed by n-type zones 8 in the same surface region 3. The surface area of the surface zones 9 is such that the breakdown voltage of the diodes formed by the n-type zones and the p-type surface region 3, referred to hereinafter as diodes for short, is at least substantially determined by the comparatively low doping concentration of the surface region 3 and is not or at least substantially not influenced by the surface zones 9.

The surface zones 9 extend from the surface 2 into the semiconductor body through a depth which is smaller than the depth of the n-type zones 8 formed in the surface region 3 during programming. In the lateral direction, the surface zones 9 extend over the entire surface area of a surface region 3 and laterally adjoin the formed diodes 8.

To clarify the effects obtained by the invention, it is first explained how information is written. In principle, two voltages suffice for programming, the values 0 V and −10 V being used here. FIG. 1 diagrammatically shows this by means of the switches S with which the lines 3 can be selectively connected to the 0 V line 14 or the −10 V line 15. In an analogous manner, the lines 5 may be connected to the line 16 or the line 17 which correspond to 0 V and −10 V, respectively. The way in which dam are written is explained with reference to FIG. 4 which shows a matrix of four horizontal lines 5a–5d and four vertical lines 3a–3d. Diodes (as previously defined) are formed at the intersections between the vertical line 3a and the horizontal lines 5a, 5b and 5c by breakthrough of the dielectric layer. To form such a diode also at the intersection between 3b and 5b, a voltage of 0 V is applied to the vertical line 3b (p-type surface region 3) and a voltage of −10 V to the horizontal line 5b (n-type poly). It is assumed that breakdown takes place at a voltage of 10 V across the dielectric layer 4. A voltage of −10 V is applied to the non-selected lines 3a, 3c and 3d, while a voltage of 0 V is applied to the non-selected horizontal lines 5a, 5c and 5d. The voltage of 10 V is fully across the dielectric layer at the intersection 3b, 5b, so that this layer can puncture at this area whereby a diode is formed. At the intersections which are not yet programmed, depicted in the drawing as capacitors, the 0 V on the lines 5 causes a depletion layer in the subjacent p-type regions 3, so that the 10 V between the lines 3 and 5 is partly across this depletion layer and only partly across the dielectric layer, so that no breakdown occurs in the dielectric layer. Equally, such breakdown does not occur in the half-selected cells where a voltage of 0 V is across the dielectric layer.

A voltage of 10 V in the reverse direction is across the diode in the cell defined by the intersection 3a, 5a, which means that the breakdown voltage of the diodes (as previously defined) must be greater than 10 V. Simultaneously, a voltage of 0 V is across the diode in the cell at the intersection 3a, 5b. In this situation, punch-through between the diodes at points 3a, 5a and 3a, 5b may cause a current to flow between the lines 5a and 5b. Both the breakdown voltage of the diodes and the punch-through voltage are determined by the doping concentration of the p-type regions 3, as is shown in FIG. 5. In this diagram, the lines A and B represent the breakdown voltage $V_{bd}$ of the diodes and the punch-through voltage $V_{pt}$, respectively, as a function of the doping concentration $N_a$ in the p-type surface region 3. The surface region is assumed to have a uniform doping. The interspacing between adjoining diodes is 0.6 µm. The punch-through voltage is defined as the voltage at which the leakage current between the lines 5a and 5b is 2 nA. As is shown in the Figure, $V_{pt}$ rises with a rising $N_a$ value. If the leakage current must not be greater than a predetermined value, for example 1 nA, a value must be chosen for $N_a$ which lies to the right of the point of intersection between curve B and the broken line V=10 V. At a higher concentration, however, the breakdown voltage decreases, as shown by curve A. Since the breakdown voltage of the diodes must be higher than the programming voltage, this higher than 10 V, a value must be chosen for the doping which lies to the left of the point of intersection between curve A and the line V=10 V. Since both conditions must be fulfilled, the doping concentration in the region 3, in the case of a uniform doping, must be chosen within fairly narrow limits, so that the risk of errors becomes great.

The invention utilizes the fact that the diodes 8 are formed through an opening 7 in the ONO layer 4 of extremely small dimensions, so that the diode in the semiconductor body is substantially point-shaped with a very strong curvature at the bottom of the diode. The electrical breakdown of the diode as a result takes place at a maximum distance from the surface 2 where, owing to the curvature, the electric fields are strongest. The leakage current caused by punch-through runs for the major part along or very close to the surface 2. It is possible to suppress punch-through to a considerable extent in that, according to the invention, the surface concentration of the narrow zone 9 is increased, without appreciably reducing the breakdown voltage of the diodes 8.

In a specific embodiment in which the regions 3 are formed by an epitaxial layer, the doping concentration $N_a$ is, for example, $4 * 10^{16}$ atoms per cm$^3$, while the surface concentration of the zones 9 is approximately $1.7 * 10^{17}$ atoms per cm$^3$. Given a Gaussian doping profile with a characteristic length equal to or at least substantially equal to the depth of the diode 8, the breakdown voltage still was approximately 15 V owing to the low background concentration in the region 3.

On the other hand, the punch-through voltage was well above 10 V owing to the higher surface concentration in the p-type region 3.

The device may be manufactured by techniques which are known per se. For a fuller description of the process, reference is made to European Patent Application 92203576.1 filed on Nov. 20th, 1992, corresponding to U.S. Pat. No. 5,416,343 (commonly assigned) the contents of which are deemed to be herein incorporated by reference. Several steps in the process are described here for the sake of clarity. The process starts, for example, with an n-type substrate 1 of silicon which is provided at its surface with a strongly doped p-type surface zone from which the buffed zones 10 will be formed in a later stage of the process. Subsequently a p-type epitaxial layer with a doping concentration much lower than that of the buffed layer, for example $4 * 10^{16}$ atoms per cm$^3$, is deposited on the surface of the n-type substrate. The thickness of the epitaxial layer 3 is approximately 0.5 µm. Then the insulation regions 6 may be formed by anisotropic etching, whereby U-grooves are formed which extend in the same direction in the semiconductor body as the selection lines 3a, 3b, 3c etc. The interspacing between the grooves and the width of the grooves are, for example, 0.5 µm and 0.25 µm, respectively. These dimensions may be obtained, as described in the cited commonly-owned prior Application and patent, by phase shifting techniques known per se. The grooves 6 are covered along their walls with a thin oxide layer and then filled up with, for example, polycrystalline silicon so that a substantially plane surface is obtained. The grooves extend transversely to the surface down to a depth greater than the depth of the buffed layer 6, for example, a depth of approximately 1 µm, and accordingly divide the buffed layer into separate selection lines 3a, 3b, etc. Then the dielectric ONO layer 4 is provided in the form of a double layer of approximately 2 nm thick silicon oxide, approximately 6 nm thick silicon nitride, followed by approximately 2 nm thick silicon oxide. The thin and comparatively strongly doped p-type surface zone 9 can be provided in a next step, for example, by maskless implantation. This implantation is carried out at an implantation energy of approximately 10 keV, followed by an annealing step during approximately 30 minutes at approximately 900° C. Obviously, the implantation step may alternatively be carried out before the ONO layer 4 is provided. The lines 5 are formed from an approximately 0.3 µm thick n-type poly layer with a doping of approximately 1020 atoms per $cm^3$. The interspacing between the conductor tracks 5a, 5b, 5c etc. and the width of the conductor tracks 5 may again be made very small by means of the said phase shifting techniques. Since practice has shown that the diodes are formed approximately centrally below the poly tracks 5, the distance between the diodes is approximately 0.5 µm. Such a small distance, which renders it possible to achieve a very high density, can be realized without punch-through effects between adjoining diodes due to the more strongly doped surface zone 9.

The more strongly doped surface zone 9 may be provided in this embodiment by means of an implantation carried out over the entire surface area of the memory matrix so that the more strongly doped zone 9 can also be advantageously provided below the poly, along the edges of the grooves 6.

FIG. 6 shows a modification of the embodiment of FIG. 3. The more strongly doped p-type region is now formed not by a zone uniformly provided over the entire matrix, but by a number of mutually separated zones 12 which are laterally separated from the diodes 8 and accordingly form no pn junctions therewith. The zones 12 were provided by self-alignment relative to the poly tracks 5a, 5b, 5c etc., such that they extend chiefly in the regions between the poly tracks and not or at least substantially not below the poly tracks. This embodiment has the advantage over the previous embodiment inter alia that the doping concentration and the depth of the zones 12 can be chosen with a higher degree of freedom with a view to an optimum punch-through suppression. Thus it is allowable for the depth of the zones 12 to be greater than that of the diodes 8, without reducing the breakdown voltage of the diodes 8, when the diodes 8 are not formed under the edge of the poly tracks, as is also shown in FIG. 6. During the manufacture of the device, the zones 12 may be provided after the poly tracks 5 were defined, either in a photoresist mask or after etching of the poly layer which is deposited on the surface for the tracks 5. The surface does have to be masked against the implantation locally by means of a mask while the zones 12 are being provided.

It will be clear that the invention is not limited to the embodiments given here, but that many more variations are possible to those skilled in the art within the scope of the invention. Thus, for example, the surface region 3 may alternatively comprise a polycrystalline semiconductor region deposited on a substrate instead of a portion of a monocrystalline semiconductor body. The conductivity types may be reversed in the embodiments described. The selection lines 3a, 3b, etc. may alternatively be separated from one another by means of insulation regions known per se other than the grooves 6.

I claim:

1. A programmable semiconductor device comprising a semiconductor body provided with a comparatively weakly doped surface region of a first conductivity type which is covered by a dielectric layer on which a number of semiconductor regions of a second, opposite conductivity type and a comparatively high doping concentration are provided side by side, each semiconductor region in combination with a subjacent portion of the dielectric layer and the surface region forming a programmable element which is programmed in that a sufficiently high voltage is applied between the semiconductor region and the surface region, so that owing to breakdown across the dielectric layer a zone of the second conductivity type is formed in the surface region, said zone being conductively connected to the semiconductor region and forming a rectifying junction between the semiconductor region and the surface region, characterized in that the surface region is provided with at least one surface zone of the same conductivity type as and with a higher doping concentration than that of the surface region, said surface zone extending between the semiconductor regions and having a surface area within the surface region such that the breakdown voltage of rectifying junctions formed during programming is at least substantially determined by the comparatively weakly doped surface region and is at least substantially not influenced by the surface zone, and in that the surface zone of the first conductivity type extends from the surface in a direction transverse to the surface into the semiconductor body over a depth which is smaller than the depth of the zone of the second conductivity type which is formed in the surface region of the first conductivity type during said programming and which adjoins the surface zone of the first conductivity type.

2. A semiconductor device as claimed in claim 1, characterized in that the at least one surface zone comprises a plurality of surface zones which are mutually separate and are provided in a self-aligned manner relative to the semiconductor regions of the second conductivity type in regions of the surface region which are situated between the semiconductor regions of the second conductivity type.

3. A semiconductor device as claimed in claim 1, characterized in that the surface region of the first conductivity type merges into a substrate region of the second conductivity type at a side opposed to the surface via a pn junction, a buried layer of the first conductivity type with a higher doping concentration than the surface region being formed at an interface between the surface region and the substrate.

4. A semiconductor device as claimed in claim 1, characterized in that the surface region is formed by a layer of the first conductivity type which is epitaxially provided on a substrate of the second conductivity type.

5. A programmable semiconductor memory, comprising a programmable semiconductor device as claimed in claim 1.

6. A programmable semiconductor device comprising a semiconductor body provided with a comparatively weakly doped surface region of a first conductivity type which is covered by a dielectric layer on which a number of semiconductor regions of a second, opposite conductivity type and a comparatively high doping concentration are provided side by side, each semiconductor region in combination with a subjacent portion of the dielectric layer and the surface region forming a programmable element which is programmed in that a sufficiently high voltage is applied between the semiconductor region and the surface region, so that owing to breakdown across the dielectric layer a zone of the second conductivity type is formed in the surface region, said zone being conductively connected to the semiconductor region and forming a rectifying junction between the semiconductor region and the surface region, characterized in that the surface region is provided with at least one surface zone of the same conductivity type as and with a higher doping concentration than that of the surface region, said surface zone extending between the semiconductor regions and having a surface area within the surface region such that the breakdown voltage of rectifying junctions formed during programming is at least substantially determined by the comparatively weakly doped surface region and is at least substantially not influenced by the surface zone, in that the at least one surface zone comprises a plurality of surface zones which are mutually separate and are provided in a self-aligned manner relative to the semiconductor regions of the second conductivity type in regions of the surface region which are situated between the semiconductor regions of the second conductivity type, and in that the surface region of the first conductivity type merges into a substrate region of the second conductivity type at a side opposed to the surface via a pn junction, a buried layer of the first conductivity type with a higher doping concentration that the surface region being formed at an interface between the surface region and the substrate.

7. A programmable semiconductor device comprising a semiconductor body provided with a comparatively weakly doped surface region of a first conductivity type which is covered by a dielectric layer on which a number of semiconductor regions of a second, opposite conductivity type and a comparatively high doping concentration are provided side by side, each semiconductor region in combination with a subjacent portion of the dielectric layer and the surface region forming a programmable element which is programmed in that a sufficiently high voltage is applied between the semiconductor region and the surface region, so that owing to breakdown across the dielectric layer a zone of the second conductivity type is formed in the surface region, said zone being conductively connected to the semiconductor region and forming a rectifying junction between the semiconductor region and the surface region, characterized in that the surface region is provided with at least one surface zone of the same conductivity type as and with a higher doping concentration than that of the surface region, said surface zone extending between the semiconductor regions and having a surface area within the surface region such that the breakdown voltage of rectifying junctions formed during programming is at least substantially determined by the comparatively weakly doped surface region and is at least substantially not influenced by the surface zone, in that the at least one surface zone comprises a plurality of surface zones which are mutually separate and are provided in a self-aligned manner relative to the semiconductor regions of the second conductivity type in regions of the surface region which are situated between the semiconductor regions of the second conductivity type, and in that the surface region is formed by a layer of the first conductivity type which is epitaxially provided on a substrate of the second conductivity type.

* * * * *